United States Patent
Betsui

(10) Patent No.: US 9,839,130 B1
(45) Date of Patent: Dec. 5, 2017

(54) SEMICONDUCTOR INTEGRATED CIRCUIT DEVICE, PRINTED BOARD AND MANUFACTURING METHOD OF THE SEMICONDUCTOR INTEGRATED CIRCUIT DEVICE

(71) Applicant: Renesas Electronics Corporation, Koutou-ku, Tokyo (JP)

(72) Inventor: Takafumi Betsui, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/480,353

(22) Filed: Apr. 5, 2017

(30) Foreign Application Priority Data

Jun. 1, 2016 (JP) ................. 2016-110096

(51) Int. Cl.
| | |
|---|---|
| *H05K 1/18* | (2006.01) |
| *H05K 1/02* | (2006.01) |
| *H05K 3/46* | (2006.01) |
| *H05K 3/30* | (2006.01) |
| *H01L 23/495* | (2006.01) |

(52) U.S. Cl.
CPC ....... *H05K 1/182* (2013.01); *H01L 23/49589* (2013.01); *H05K 1/0231* (2013.01); *H05K 1/0233* (2013.01); *H05K 1/0234* (2013.01); *H05K 1/183* (2013.01); *H05K 3/301* (2013.01); *H05K 3/4697* (2013.01)

(58) Field of Classification Search
CPC ........ H05K 1/182; H05K 1/183; H05K 1/185; H05K 1/186; H05K 1/187; H05K 1/188
See application file for complete search history.

(56) References Cited

PUBLICATIONS

Dai Nippon Printing Co., Ltd., "B2it board and component built-in board", [online], [searched on Jun. 1, 2016], Internet <URL: http://www.dnp.co.jp/about/business/fine/product5.html>.

*Primary Examiner* — Jeremy C Norris
(74) *Attorney, Agent, or Firm* — Shapiro, Gabor and Rosenberger, PLLC

(57) ABSTRACT

A semiconductor integrated circuit device (101) includes a component built-in board (21) in which at least a first core layer (Co21) on which a first electronic component (C21) is mounted, a second core layer (Co22) on which a second electronic component (C22) is mounted, an adhesive layer (Ad21) arranged between the first core layer (Co21) and the second core layer (Co22), and wiring layers (L21-L28) are stacked; a third electronic component (SoC) mounted in a first core layer (Co21) side of the component built-in board (21) and electrically connected to at least one of the first and second electronic components (C21, C22) through the wiring layers (L21 to L28); and an external connection terminal (BE) formed in a second core layer (Co22) side of the component built-in board (21) and electrically connected to at least one of the first and second electronic components (C21, C22).

10 Claims, 11 Drawing Sheets

SEMICONDUCTOR INTEGRATED CIRCUIT DEVICE, PRINTED BOARD AND MANUFACTURING METHOD OF THE SEMICONDUCTOR INTEGRATED CIRCUIT DEVICE

CROSS-REFERENCE TO RELATED APPLICATIONS

This application is based upon and claims the benefit of priority from Japanese patent application No. 2016-110096, filed on Jun. 1, 2016, the disclosure of which is incorporated herein in its entirety by reference.

BACKGROUND

The present invention relates to a semiconductor integrated circuit device, a printed board, and a manufacturing method of the semiconductor integrated circuit device.

A component built-in board that enables three-dimensional mounting has been developed. For example, Dai Nippon Printing Co., Ltd., "B2it board and component built-in board", [online], [searched on Jun. 1, 2016], Internet <URL: http://www.dnp.co.jp/about/business/fine/product5.html> discloses a manufacturing method of a component built-in board in which a cavity is formed in a multilayer interconnection board and an electronic component is mounted in the cavity.

SUMMARY

For use in mobile terminals and the like, a component built-in board with a thickness reduced to within a range of about 100 to 400 µm is under development. On the other hand, if the component built-in board is mounted on vehicles and the like, the board has to be formed to have a large thickness of about 800 µm so as to prevent warpage. This causes a problem that the number of electronic components to be mounted on one of the principal surfaces of the board becomes large, so that the electrical components can be electrically connected only from the principal surface, and an increase in the depth of the cavity leads to deterioration of the accuracy of mounting the electronic components to be mounted.

Accordingly, there has been a demand for providing a semiconductor integrated circuit device, a printed board, and a manufacturing method of the semiconductor integrated circuit device which are excellent in wiring capability and electric characteristics even when the thickness of the component built-in board is increased.

Other problems to be solved by and novel features of the present invention will become apparent from the following description and the accompanying drawings.

According to one aspect, a semiconductor integrated circuit device includes: a component built-in board in which at least a first core layer on which a first electronic component is mounted, a second core layer on which a second electronic component is mounted, an adhesive layer arranged between the first core layer and the second core layer, and a wiring layer are stacked; a third electronic component mounted in a first core layer side of the component built-in board and electrically connected to at least one of the first electronic component and the second electronic component through the wiring layer; and an external connection terminal formed in a second core layer side of the component built-in board and electrically connected to at least one of the first electronic component and the second electronic component through the wiring layer.

Replacement of the semiconductor integrated circuit device of the above-mentioned aspect by a hybrid integrated circuit device that is composed of a semiconductor chip, electronic components (passive components), a substrate, and the like, or a semiconductor module, a manufacturing method of a printed board, a semiconductor integrated circuit device, and the like are also effective as one aspect of the present invention.

According to the above-mentioned aspect, it is possible to provide a semiconductor integrated circuit device, a printed board, and a manufacturing method of the semiconductor integrated circuit device which are excellent in wiring capability and electric characteristics even when the thickness of the component built-in board is increased.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
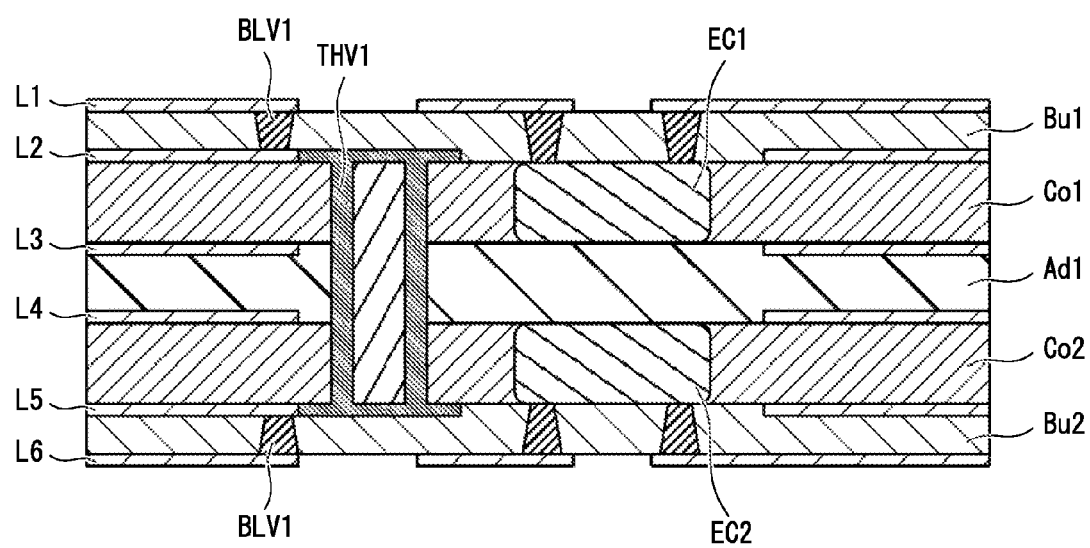
FIG. 1 is a sectional view showing a schematic configuration of a component built-in board 1 according to a first embodiment.

For clarity of explanation, the following description and the drawings are abbreviated or simplified as appropriate. The same components are denoted by the same reference numerals throughout the drawings, and repeated descriptions thereof are omitted as appropriate. For clarity of illustration in the drawings, hatching and the like for sections may be omitted.

First Embodiment

A semiconductor integrated circuit device according to a first embodiment has a configuration in which a component built-in board is formed in such a manner that two or more core layers each having a cavity in which electronic components are mounted are bonded through an adhesive layer; the electronic components is mounted on the front surface of the component built-in board; and an external connection terminal is formed on the back surface of the component built-in board. This configuration makes it possible to provide a semiconductor integrated circuit device having excellent wiring capability and electric characteristics even when the thickness of the component built-in board is increased.

First, the component built-in board that constitutes a part of the semiconductor integrated circuit device according to the first embodiment will be described.

FIG. 1 is a sectional view showing a schematic configuration of a component built-in board 1 according to the first embodiment.

In the component built-in board 1, an uppermost metal wiring layer (first metal wiring layer) L1, a front-side build-up layer (first build-up layer) Bu1, a second metal wiring layer L2, a first core layer Co1, a third metal wiring layer L3, an adhesive layer Ad1, a fourth metal wiring layer L4, a second core layer Co2, a fifth metal wiring layer L5, a back-surface-side build-up layer (second build-up layer) Bu2, a lowermost metal wiring layer (sixth metal wiring layer) L6, and the like are stacked in order from the top of the figure.

The component built-in board 1 also includes: a first electronic component EC1 and a second electronic component EC2 which are respectively mounted in cavities (not shown) that are formed in the first core layer Co1 and the second core layer Co2, respectively; a plurality of non-through electrodes (blind vias) BLV1 that electrically connect the uppermost metal wiring layer L1 and the first electronic component EC1 to each other and electrically connect the second electronic component EC2 and the lowermost metal wiring layer L6 to each other; and a through electrode (through via) THV1 that penetrates through the first core layer Co1, the adhesive layer Ad1, and the second core layer Co2 and electrically connects the second metal wiring layer L2 and the fifth metal wiring layer L5 to each other.

A part of the uppermost metal wiring layer L1 and a part of the lowermost metal wiring layer L6 may constitute a land, and an exposed part of each of the uppermost metal wiring layer L1, the front-side build-up layer Bu1, the back-surface-side build-up layer Bu2, and the lowermost metal wiring layer L6 may include a protective layer of a solder resist.

In the component built-in board 1, for example, copper (Cu) is used for each of the metal wiring layers L1 to L6. An epoxy phenol resin having a thickness of 30 to 40 µm is used for each of the build-up layers But and Bu2. A glass epoxy resin having a thickness of 300 to 400 µm is used for each of the core layers Co1 and Co2. A thermosetting glass epoxy resin, such as prepreg, having a thickness of 100 to 200 µm is used for the adhesive layer Ad1.

The first electronic component EC1 and the second electronic component EC2 are, for example, bare chips, capacitors, inductance elements, resistors, or the like.

With this configuration, the component built-in board 1 according to the first embodiment makes it possible to increase the entire thickness of the board to 800 µm or more, the cavities formed in the core layers Co1 and Co2, respectively, are shallow and thus the electronic components EC1 and EC2 can be easily mounted in the cavities, respectively, and the electrical connection to the electronic components EC1 and EC2 is facilitated. Therefore, the component built-in board 1 has excellent wiring capability and electric characteristics.

Next, a manufacturing method of the component built-in board 1 according to the first embodiment will be described.

FIGS. 2A-2D are process sectional views for explaining the manufacturing method of the component built-in board 1 according to the first embodiment.

Figure 2A:
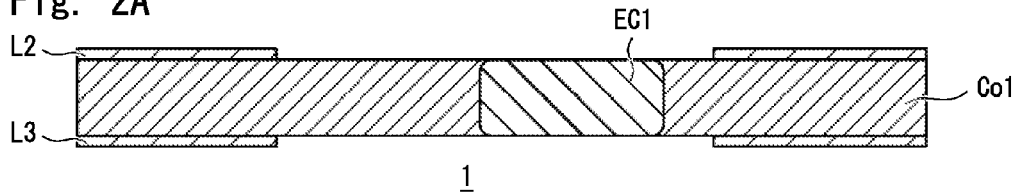
FIGS. 2A-2D are process sectional views for explaining a manufacturing method of the component built-in board 1 according to the first embodiment.

First, as shown in FIG. 2A, a cavity (not shown) is formed in the first core layer Co1 having principal surfaces on each of which the second metal wiring layer L2 or the third metal wiring layer L3 is formed, and the electronic component EC1 is mounted in the cavity. Further, a resin is injected into the cavity in which the electronic component EC1 is mounted, so that the electronic component EC1 is sealed and incorporated in the first core layer Co1. The metal wiring layers L2 and L3 may be formed after the electronic component EC1 is incorporated in the first core layer Co1.

Similarly, a cavity is formed in the second core layer Co2 having principal surfaces on each of which the fourth metal wiring layer L4 or the fifth metal wiring layer L5 is formed, and the electronic component EC2 is mounted in the cavity and sealed (not shown). In this case, the thickness of each of the first core layer Co1 and the second core layer Co2 is about 400 µm as described above, and thus the electronic components EC1 and EC2 can be mounted with high accuracy.

Figure 2B:
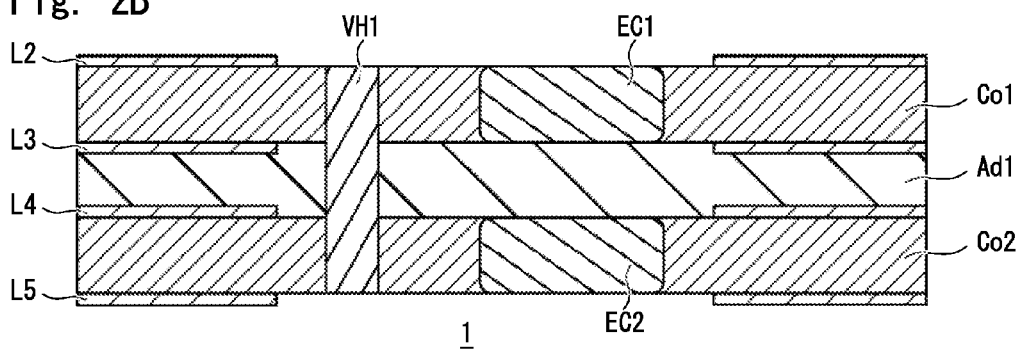

Next, as shown in FIG. 2B, the first core layer Co1 and the second core layer Co2 are bonded with the adhesive layer Ad1 in such a manner that the principal surface of the first core layer Co1 where the metal line L3 is formed and the principal surface of the second core layer Co2 where the metal line L4 is formed face inward. Further, a through via hole VH1 that penetrates through the first core layer Co1, the adhesive layer Ad1, and the second core layer Co2 is formed by a drill.

Figure 2C:
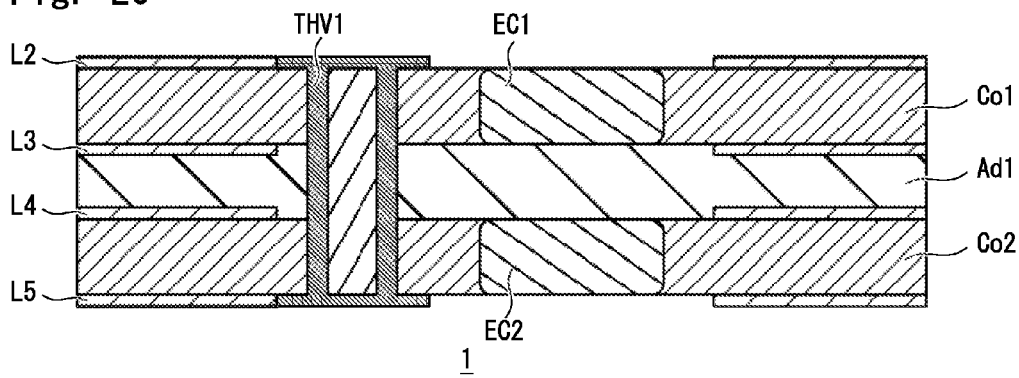

Next, as shown in FIG. 2C, the through electrode THV1 is formed by plating the inner periphery of the through via hole VH1 with a metal.

Figure 2D:
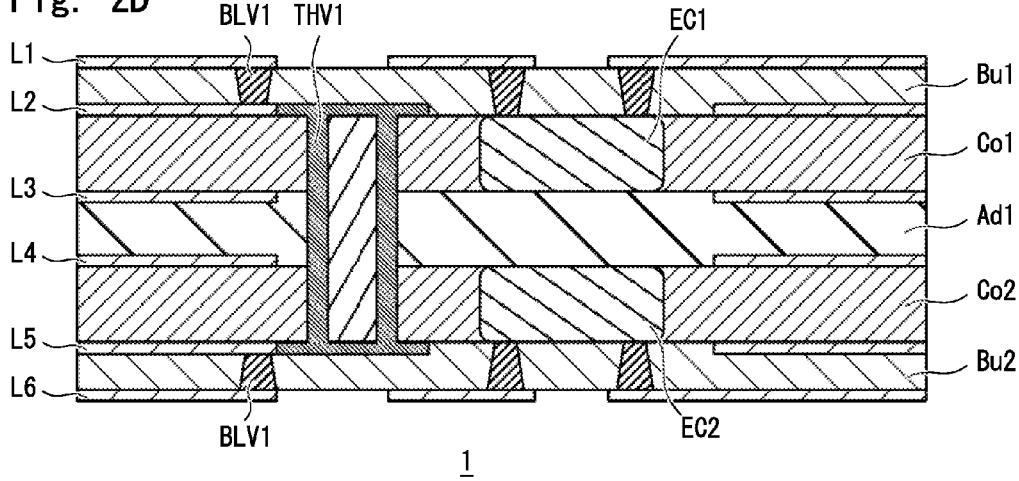

Lastly, as shown in FIG. 2D, the first build-up layer Bu1 is formed on the principal layer of the first core layer Co1 where the metal line L2 is formed, and the second build-up layer Bu2 is formed on the principal surface of the second core layer Co2 where the metal line L5 is formed. Further, a blind via hole (not shown) that leads to the metal wiring layers L2 and L5 from the front surface (exposed surface) of each of the built-up layers But and Bu2 is formed by a laser. The blind via hole is filled with a metal to form the non-through electrode BLV1, and the uppermost metal wiring layer L1 and the lowermost metal wiring layer L6 are respectively formed on the front surfaces of the build-up layers But and Bu2. Furthermore, the protective layer (not shown) of the solder resist as mentioned above is formed as needed. Thus, the component built-in board 1 is completed.

In the component built-in board 1, the build-up layers But and Bu2 are formed after the core layers Co1 and Co2 are bonded with the adhesive layer, but instead the core layers on each of which a build-up layer is formed may be bonded together.

Figure 3:
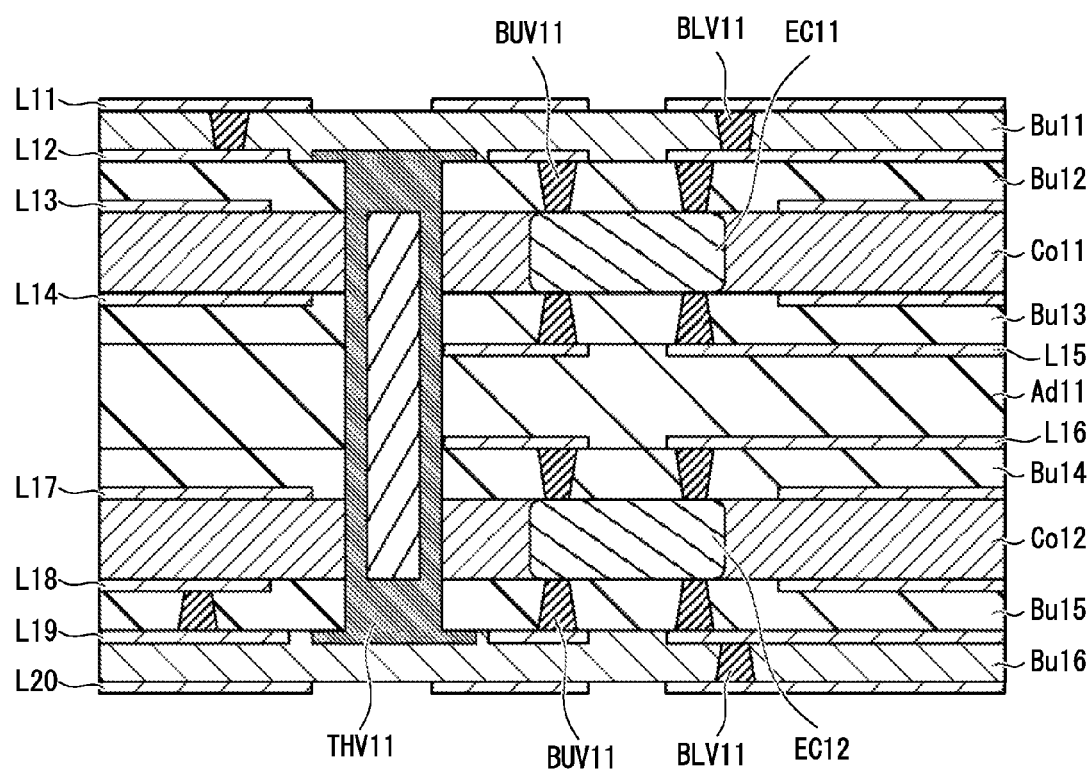
FIG. 3 is a sectional view showing a schematic configuration of another component built-in board 11 according to the first embodiment.

FIG. 3 is a sectional view showing a schematic configuration of another component built-in board 11 according to the first embodiment.

The component built-in board 11 includes: two electronic components EC11 and EC12; two core layers Co11 and Co12; six build-up layers Bu11 to Bu16; ten metal wiring layers L11 to L20; one adhesive layer Ad11; a plurality of non-through electrodes (buried vias) BUV11 that electrically connect the terminals of the electronic components EC11 and EC12 to the metal lines L12, L14, L16, and L19, respectively, and electrically connect the metal line L18 to the metal line L19; a plurality of non-through electrode (blind via) BLV11 that electrically connect the uppermost metal wiring layer L1 to the second metal wiring layer L2 and electrically connect the ninth metal wiring layer L19 to the lowermost metal wiring layer L20; and a through electrode (through via) THV11 that penetrates from the second build-up layer Bu12 to the fifth build-up layer Bu15.

The component built-in board 11 has the following configuration. That is, a structure in which the electronic component EC11 is mounted in the cavity (not shown) of the first core layer Co11 having principal surfaces on each of which the metal wiring layer L13 or the metal wiring layer L14 is formed and two build-up layers Bu12 and Bu13, the plurality of non-through electrodes BUV11, and two metal wiring layers L12 and L15 are formed and a structure in which the electronic component EC12 is mounted in the cavity (not shown) of the second core layer Co12 having principal surfaces on each which the metal wiring layer L17 or the metal wiring layer L18 is formed and two build-up layers Bu14 and Bu15, the plurality of non-through electrodes BUV11, and two metal wiring layers L16 and L18 are formed, that is, structures in which build-up layers are formed on a core layer, are bonded together through the adhesive layer Ad11. The through electrode THV11 that penetrates from the build-up layer Bu12 to the build-up layer Bu15 is formed. After that, the build-up layers Bu11 and Bu16, the plurality of non-through electrodes BLV11, and the metal wiring layers L11 and L20 are formed.

With this configuration, the component built-in board 11 according to the first embodiment makes it possible to increase the entire thickness and reduce the depth of the cavity of each of the core layers Co11 and Co12, and has excellent wiring capability and electric characteristics. Further, since the electronic components EC11 and EC12 can be electrically connected from the wiring layers L12, L15, L16, and L19 which are formed above and below the core layers Co11 and Co12 on which the electronic components EC11 and EC12 are mounted, the component built-in board 11 has particularly excellent wiring capability.

The component built-in board according to the first embodiment may include three or more core layers. For example, three core layers may be formed in such a manner that the stack of the metal wiring layers L12 to L15 of the component built-in board 11 shown in FIG. 3 is sandwiched between the metal wiring layer L3 and the metal wiring layer L4 of the component built-in board 1 shown in FIG. 1 through the adhesive layer. At this time, three electronic components incorporated in the respective core layers can be superimposed in the longitudinal direction. In other words, a number of electronic components corresponding to the number of core layers can be superimposed in the longitudinal direction.

Furthermore, a printed board may be formed using the component built-in board according to the first embodiment.

Next, a schematic configuration of a semiconductor integrated circuit device according to the first embodiment will be described.

Figure 4:
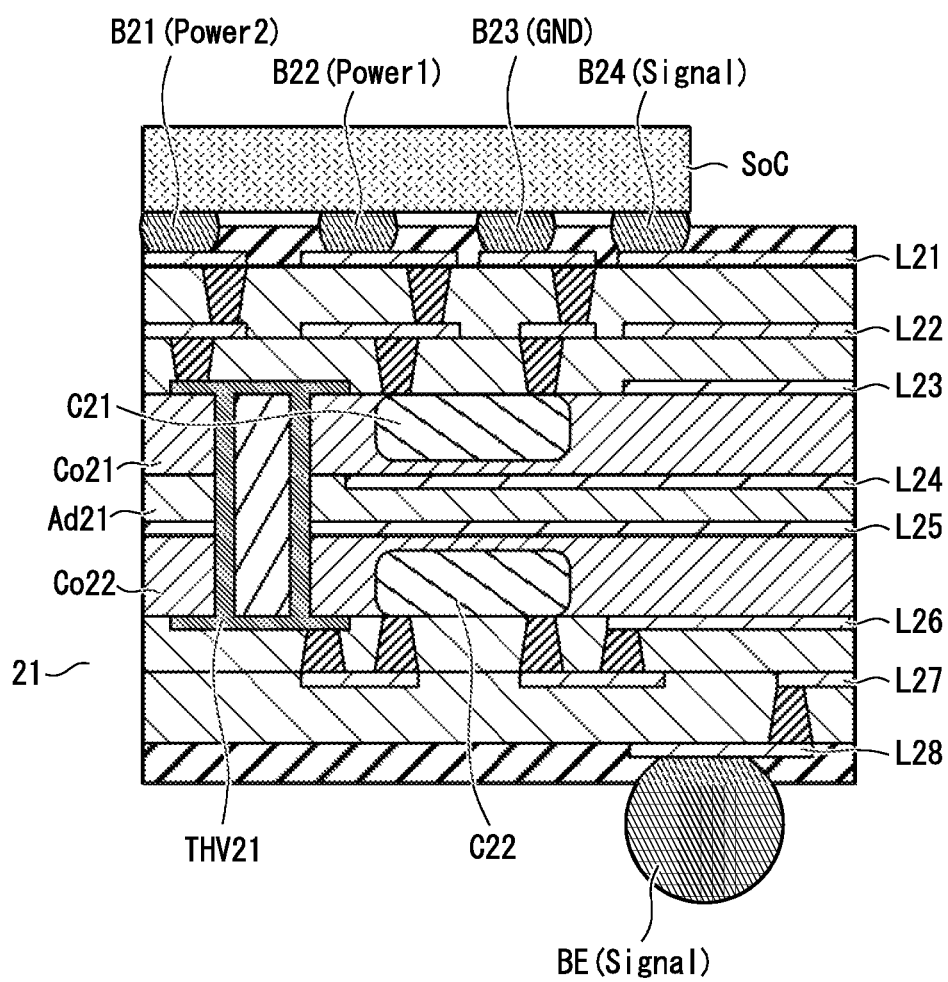
FIG. 4 is a sectional view showing a schematic configuration of a semiconductor integrated circuit device 101 according to the first embodiment.

FIG. 4 is a sectional view showing a schematic configuration of a semiconductor integrated circuit device 101 according to the first embodiment.

The semiconductor integrated circuit device 101 includes a component built-in board 21, an SoC which is flip-chip connected to the component built-in board 21 through a land and bumps B21 to B24 that are formed on the front surface of the component built-in board 21, and a ball electrode (solder ball) BE which is formed on the land of the back surface of the component built-in board 21 and constitutes a ball grid array (BGA) serving as an external connection terminal. Note that the semiconductor integrated circuit device 101 may use a land grid array (LGA), instead of the BGA, as the external connection terminal. On the front surface of the component built-in board 21, not only the SoC, but also a memory, a power management IC (PMIC), and the like may be mounted.

The component built-in board 21 incorporates capacitors C21 and C22 so as to eliminate noise in an intermediate frequency region (several tens to several hundred MHz) that flows through a feed path.

Specifically, a phenomenon in which an impedance called an anti-resonance peak increases in some specific frequencies occurs in the feed path. However, in the capacitors C21 and C22, a resonance peak with an inductance added to the path is set in the vicinity of the anti-resonance peak, thereby reducing the impedance.

When noise in a higher frequency region is eliminated, the capacitors C21 and C22 are arranged substantially immediately below a power supply terminal B22 (Power1), thereby shortening the feed path and reducing the inductance. Thus, a plurality of frequencies of a power supply impedance can be further suppressed.

Figure 5:
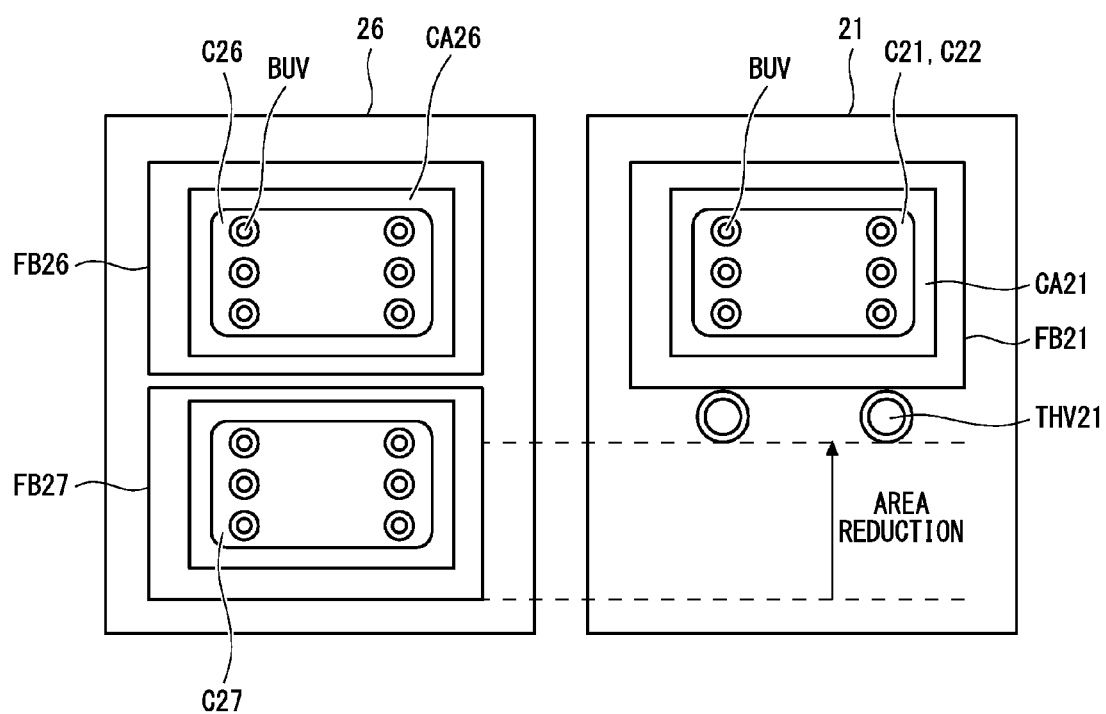
FIG. 5 is a diagram for explaining the arrangement of capacitors C21 and C22 in a component built-in board 21 according to the first embodiment.

FIG. 5 is a diagram for explaining the arrangement of the capacitors C21 and C22 in the component built-in board 21 according to the first embodiment. FIG. 5 is a perspective view of the component built-in board 21 as viewed from the top (from the side where the SoC and the like are mounted). A diagram on the left side of FIG. 5 shows the arrangement of the capacitors in a component built-in board 26 of the related art as a comparative example, and a diagram on the right side of FIG. 5 shows the arrangement of the capacitors in the component built-in board 21.

In the component built-in board 26 of the related art, a capacitor C26 is mounted in a cavity CA26 and a pattern-prohibited region FB26 is formed in the vicinity of the cavity CA26. Further, a pattern-prohibited region FB27 including a capacitor C27 is formed adjacent to the pattern-prohibited region FB26. Accordingly, in the component built-in board 26, a region in which a metal line L (not shown) can be formed is limited to an extremely small area in the layer in which at least the pattern-prohibited regions FB26 and FB27 are formed.

On the other hand, the component built-in board 21 incorporates the capacitors C21 and C22 in such a manner that the capacitors C21 and C22 are substantially superimposed when the capacitors C21 and C22 are viewed from the top, that is, the plane coordinates (XY coordinates) of the capacitors C21 and C22 are substantially the same.

Accordingly, in the component built-in board 21, even when a through electrode THV is formed adjacent to the pattern-prohibited region FB21, the region in which the metal line L can be formed can be increased as compared with the component built-in board 26, and the area of the component built-in board 21 itself can be reduced. Further, the diameter of the through electrode THV11 can be increased to thereby reduce the number of the through electrodes THV. The inductance through the feed path can also be reduced. The arrangement of the through-hole THV11 is not limited to that shown in FIG. 5, as long as the through-hole THV11 is formed outside of the pattern-prohibited region FB21.

Note that in the semiconductor integrated circuit device according to the first embodiment, when the SoC is mounted on the component built-in board, capacitors may be provided near or immediately below the respective power supply terminals of the SoC.

Figure 6:
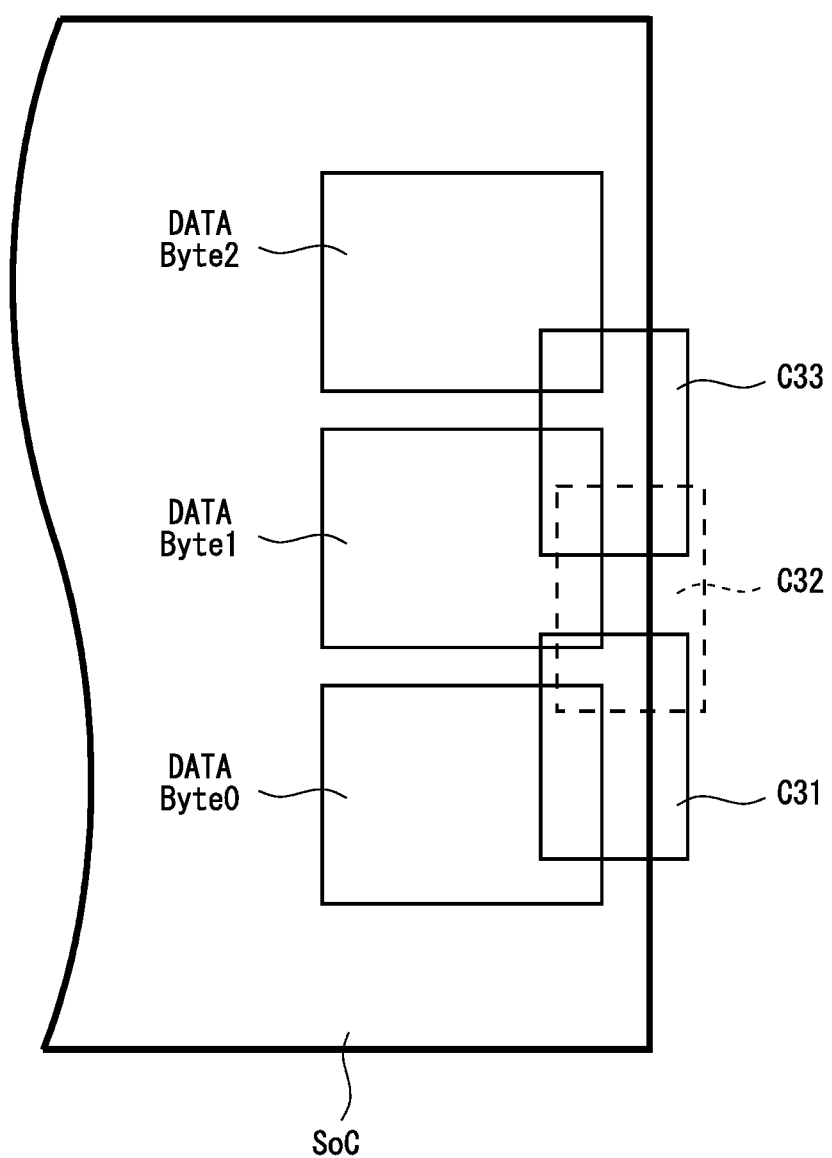
FIG. 6 is a diagram for explaining the arrangement of capacitors C31 to C33 in another semiconductor integrated circuit device according to the first embodiment.

FIG. 6 is a diagram for explaining the arrangement of capacitors C31 to C33 in another semiconductor integrated circuit device according to the first embodiment. FIG. 6 shows a perspective view of the arrangement of the component built-in board as viewed from the top of the component built-in board (from the SoC).

On the component built-in board (not shown), the SoC including a plurality of power supplies (or power supplies of the same type that need to control the impedance in specific units, for example, in units of byte) are mounted through bumps (not shown) which are formed at a fine pitch. Further, in the component built-in board, the capacitors C31 and C33 are incorporated in the upper core layer and the capacitor C32 is incorporated in the lower core layer. The capacitors C31 and C33 and the capacitor C32 are arranged in such a manner that the capacitors C31 and C33 and the capacitor C32 are partially superimposed as viewed from the top.

With this structure, even when the density of the power supply terminals (bumps) is high and wiring resources in the plane direction are insufficient in the related art, the capacitor C31 is connected to a plurality of power supply terminals for data byte0 of the SoC; the capacitor C32 is connected to a plurality of power supply terminals for data byte1; and the capacitor C33 is connected to a plurality of power supply terminals for data byte2. This configuration allows the distance between the power supply terminal and the capacitor to fall within a certain range, thereby achieving an equivalent impedance. This is especially effective in a state where the voltage of the semiconductor integrated circuit device is lowered or high speed signal processing is performed in the semiconductor integrated circuit device.

As described above, the semiconductor integrated circuit device 101 according to the first embodiment includes: the component built-in board 21 in which at least a first core layer Co21 on which the first electronic component C21 is mounted, a second core layer Co22 on which the second electronic component C22 is mounted, an adhesive layer Ad21 arranged between the first core layer Co21 and the second core layer Co22, and wiring layers L21 to L28 are stacked; a third electronic component SoC that is mounted in a first core layer Co21 side of the component built-in board 21 and is electrically connected to at least one of the first electronic component C21 and the second electronic component C22 through the wiring layers L21 to L28; and an external connection terminal BE that is formed in a second core layer Co21 side of the component built-in board 21 and is electrically connected to at least one of the first electronic component C21 and the second electronic component C22 through the wiring layers L21 to L28.

In the semiconductor integrated circuit device 101 according to the first embodiment, the first electronic component C21 and the second electronic component C22 are preferably arranged on substantially the same plane coordinates.

In the semiconductor integrated circuit device 101 according to the first embodiment, the first electronic component C21 and the second electronic component C22 are preferably arranged substantially immediately below the power supply terminal B22 (Power1) of the third electronic component SoC.

In the semiconductor integrated circuit device according to the first embodiment, the second electronic component C32 is preferably arranged in such a manner that the plane coordinates of the second electronic component C32 partially overlap the plane coordinates of the plurality of first electronic components C31 and C33.

In the semiconductor integrated circuit device 101 according to the first embodiment, the component built-in board 21 preferably includes a through electrode THV21 that penetrates through at least the first core layer Co21, the adhesive layer Ad21, and the second core layer Co22.

The printed board according to the first embodiment includes the component built-in board 21 in which at least the first core layer Co21 on which the first electronic component C21 is mounted, the second core layer Co22 on which the second electronic component C22 is mounted, the adhesive layer Ad21 arranged between the first core layer Co21 and the second core layer Co22, and the wiring layers L21 to L28 are stacked. The wiring layers L21 to L28 include the front-surface-side wiring layer L21 that electrically connects the third electronic component SoC, which is mounted in a first core layer Co21 side of the component built-in board 21, to at least one of the first and second electronic components C21 and C22, and the back-surface-side wiring layer L28 that electrically connects the external connection terminal BE, which is formed in a second core layer Co22 side of the component built-in board 21, to at least one of the first and second electronic components C21 and C22.

The manufacturing method of the semiconductor integrated circuit device 101 according to the first embodiment includes the steps of: forming cavities CA21 and CA22 in the first core layer Co21 and the second core layer Co22, respectively, on which the wiring layers L23 to L26 are formed; mounting the first electronic component C21 in the cavity CA21 of the first core layer Co21 and mounting the second electronic component C22 in the cavity CA22 of the second core layer Co22; forming the component built-in board 21 by stacking the first core layer Co21 on which the first electronic component C21 is mounted, the adhesive layer Ad21, and the second core layer Co21 on which the second electronic component C22 is mounted; mounting the third electronic component SoC to be electrically connected to the first core layer Co21 of the component built-in board 21 through at least one of the first and second electronic components C21 and C22 and the wiring layers L21 to L28, and forming the external connection terminal BE to be electrically connected to the second core layer Co21 of the component built-in board 21 through at least one of the first and second electronic components C21 and C22 and the wiring layers L21 to L28.

Second Embodiment

In the semiconductor integrated circuit device 101 according to the first embodiment, electronic components, for example, the capacitors C21 and C22, are respectively incorporated in the upper and lower core layers Co21 and Co22 of the component built-in board 21. However, in a semiconductor integrated circuit device according to a second embodiment, when electronic components, such as an SoC and a CSP (Chip Size Package), are mounted on the component built-in board, capacitors having different capacities are respectively incorporated in the upper and lower layers of the component built-in board and a common power supply terminal for the electronic components is connected to each of the capacitors having different capacities, thereby making it possible to eliminate noise in a high-frequency region and a low-frequency region.

Figure 7:
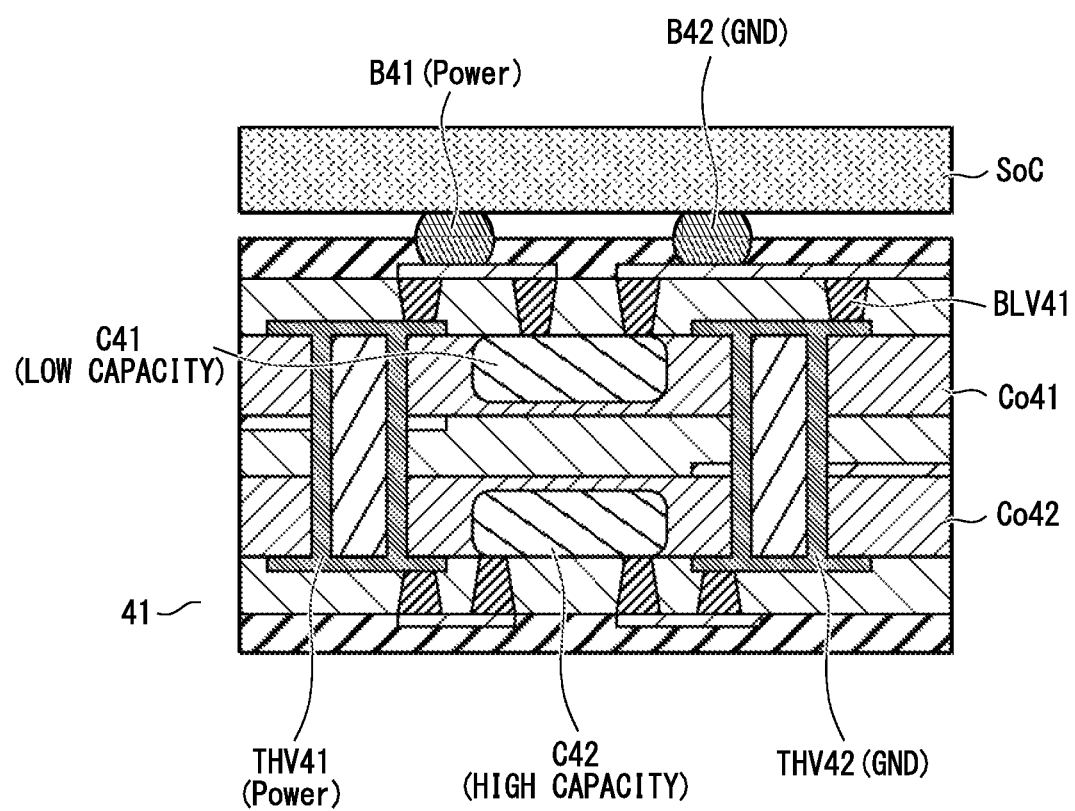
FIG. 7 is sectional view showing a schematic configuration of a semiconductor integrated circuit device 201 according to a second embodiment.

FIG. 7 is a sectional view showing a schematic configuration of a semiconductor integrated circuit device 201 according to the second embodiment.

In a component built-in board 31, an upper core layer Co41 incorporates a low-capacity capacitor C41 and a lower core layer Co42 incorporates a high-capacity capacitor C42. Further, an SoC is mounted on the component built-in board 31 through a bump B41 for supplying a power potential and a bump B42 for supplying a ground potential. The capacitors C41 and C42 preferably have substantially the same plane coordinates (XY coordinates).

The SoC and the capacitor C41 are electrically connected through the bumps B41 and B42 and non-through electrodes BLV41, and the SoC and the capacitor C42 are electrically connected through the bumps B41 and B42, the through electrodes THV41 and THV42, and the non-through electrodes BLV41.

Figure 8:
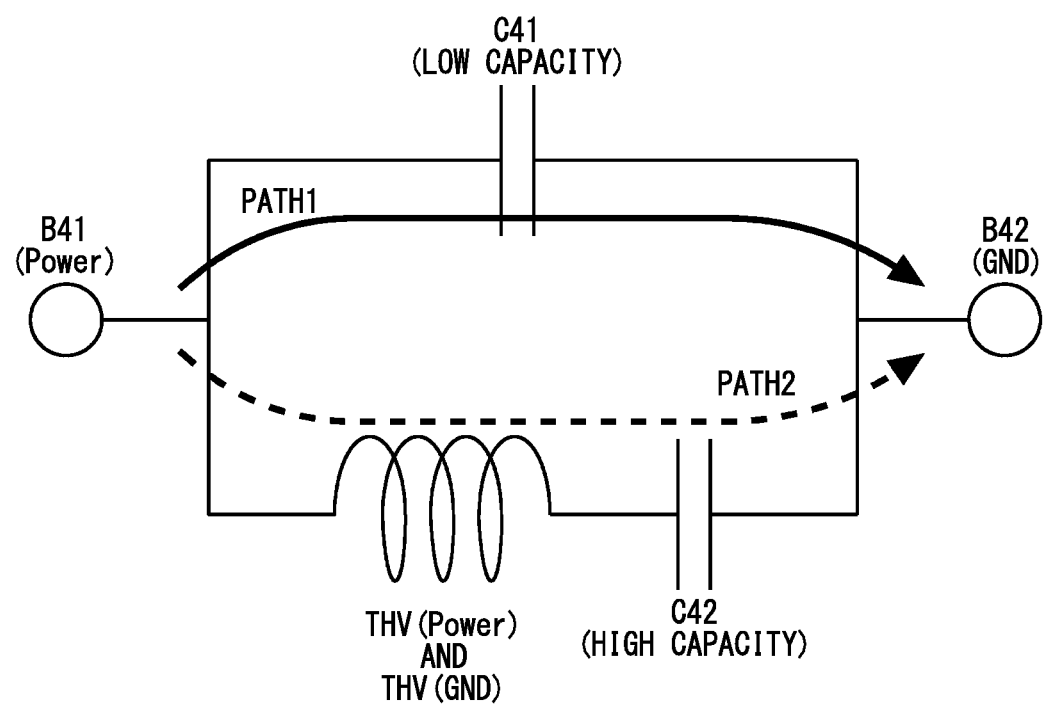
FIG. 8 is an equivalent circuit diagram of a semiconductor integrated circuit device 201 according to a second embodiment.

FIG. 8 is an equivalent circuit diagram of the semiconductor integrated circuit device 201 according to the second embodiment.

As viewed from the SoC, there are two paths leading to the bump B42, which is located near the GND terminal, from the bump B41, which is located near the power supply terminal, through the bypass capacitors C41 and C42. A path 2 which passes through the capacitor C42 of the lower core layer Co42 is provided with an inductance (about 1 to 2 nH) corresponding to the two through electrodes THV41 and THV42.

The capacitor C41 of the upper core layer Co41 has a low capacity and the capacitor C42 of the lower core layer Co42 has a high capacity. This configuration makes it possible to secure a path 1 that provides an advantageous effect of resonating at a high frequency and the path 2 that provides an advantageous effect of resonating at a low frequency.

A SiP (System in Package) which is an application example of the semiconductor integrated circuit device according to the second embodiment will be described.

Figure 9:
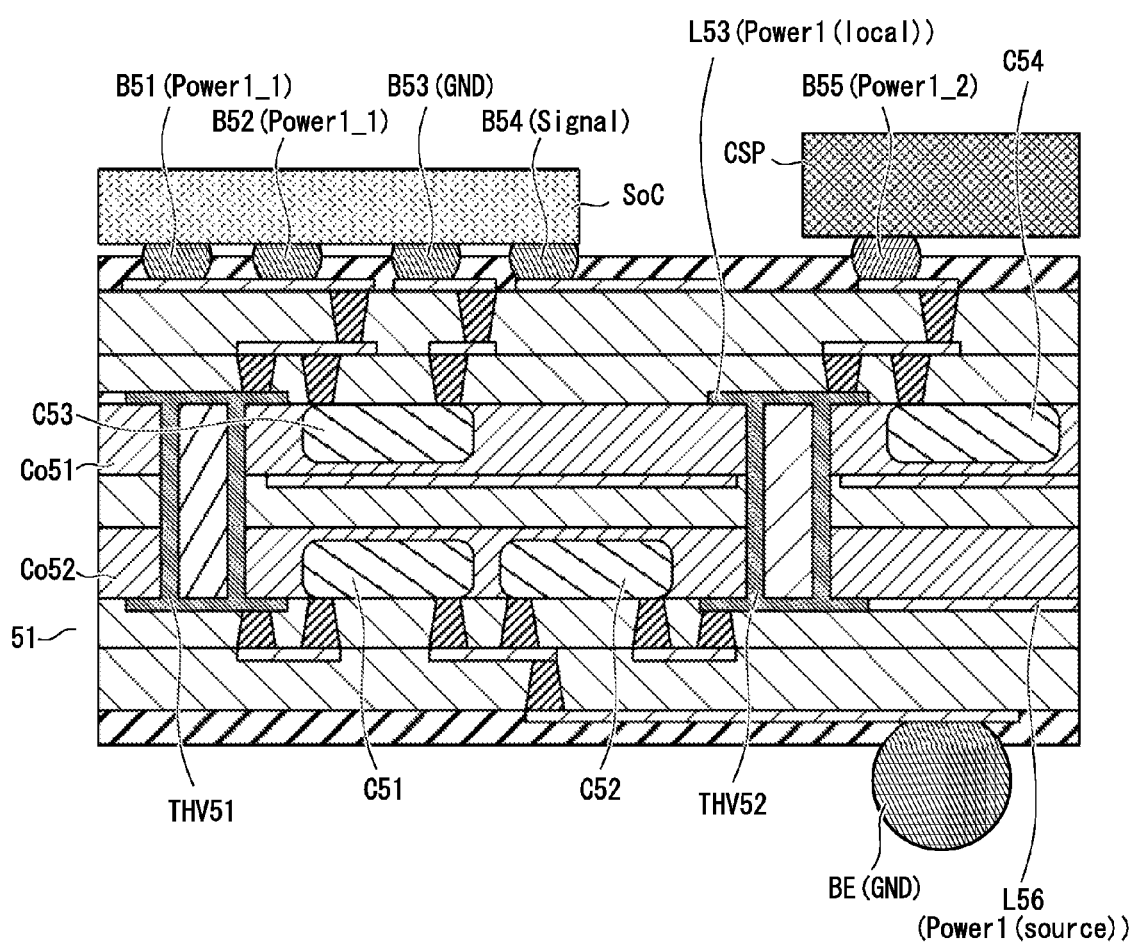
FIG. 9 is a sectional view showing a schematic configuration of a SiP 301 of an application example according to the second embodiment.

FIG. 9 is a sectional view showing a schematic configuration of a SiP 301 as an application example of the second embodiment.

The SiP 301 has a configuration in which various types of electronic components such as an SoC, a CSP, and various memories are mounted on the front surface of a component built-in board 41 and the ball electrode BE serving as the external connection terminal is formed on the back surface of the component built-in board 51.

At this time, when a voltage power supply Power1 is shared between various types of electronic components mounted on the front surface of the component built-in board 51, a common plane pattern including capacitors C51 and C52 is formed on a lower core layer Co52, and power supply terminals B51, B52, and B55 of each electronic component are supplied with power supply Power1 via through electrodes THV51 and THV52. Further, bypass capacitors C53 and C54 or a low-pass filter is connected to the core layer Co51 on this path without fail. This configuration prevents noise from entering from other electronic components via the common plane pattern.

To cope with a plurality of voltages, a plurality of common plane patterns may be provided.

With this configuration, the number of ball electrodes BE for supplying the power supply potential or the ground potential at the same potential level to various types of electronic components of the SiP can be reduced to one at minimum.

As described above, the semiconductor integrated circuit device 201 according to the second embodiment preferably has a configuration in which the low-capacity capacitor C41 serves as the first electronic component; the high-capacity capacitor C42 serves as the second electronic component; the third electronic component SoC is electrically connected to the first electronic component C41 without involving the through electrode THV and is electrically connected to the second electronic component C42 through the through electrode THV.

In the semiconductor integrated circuit device 301 according to the second embodiment, it is preferable to supply a potential from the same external connection terminal BE to the plurality of third electronic components SoC and CSP through one of the first electronic components C53 and C54 and second electronic components C51 and C52 different from the at least one thereof.

Third Embodiment

In the semiconductor integrated circuit devices 101, 201, and 301 according to the first and second embodiments, the component built-in boards 21, 41, and 51 each incorporate a plurality of capacitors. However, in a semiconductor integrated circuit device according to a third embodiment, the component built-in board incorporates a resistor or an inductance element and a capacitor, and the component built-in board is configured as a low-pass filter.

Figure 10:
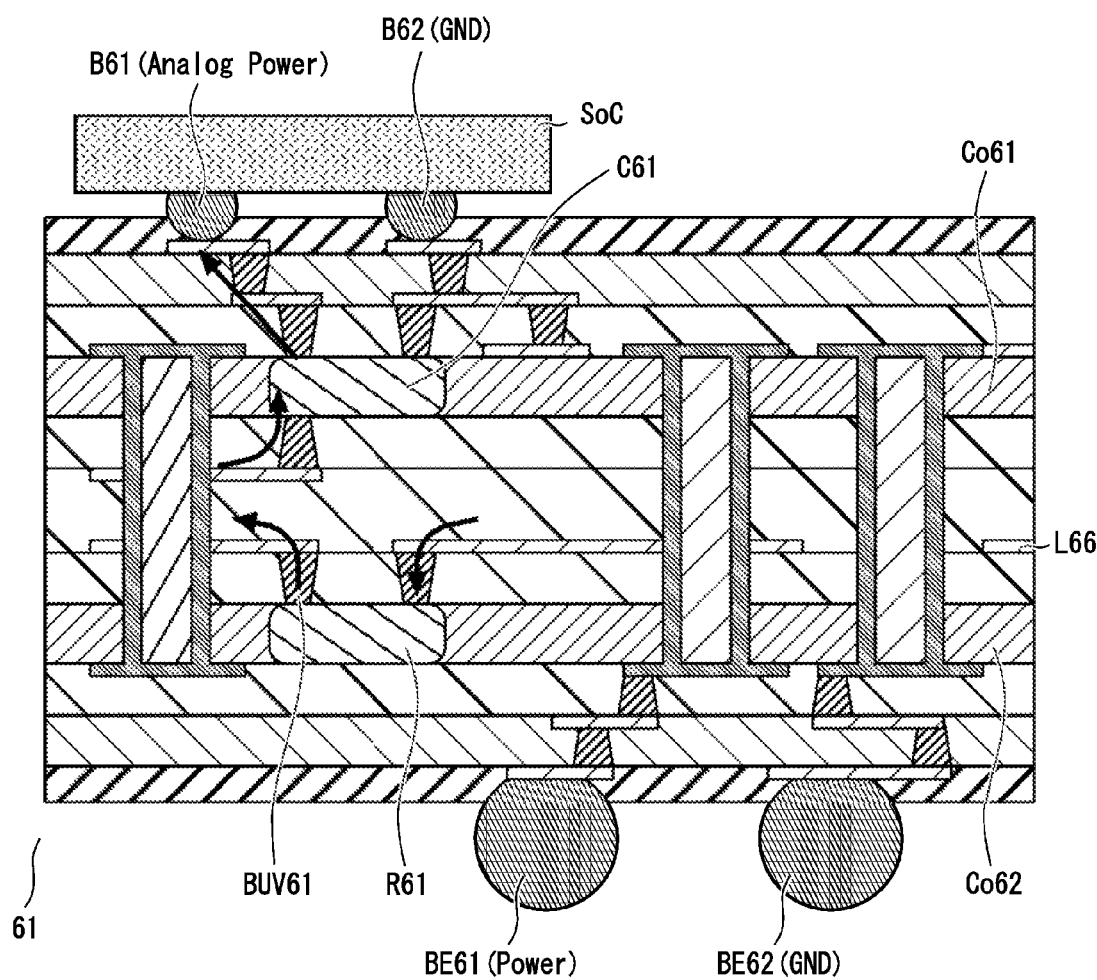
FIG. 10 is a sectional view showing a schematic configuration of a semiconductor integrated circuit device 401 according to a third embodiment.

FIG. 10 is a sectional view showing a schematic configuration of a semiconductor integrated circuit device 401 according to the third embodiment.

In a component built-in board 61, a capacitor C61 is mounted on an upper core layer Co61 and a resistor R61 is mounted on a lower core layer Co62. Instead of the resistor R61, an inductance element L such as ferrite beads may be mounted.

Although the amount of supply current is small, a low-pass filter is configured using the resistor R61 and the capacitor C61 for an analog power supply Analog Power that is separated from a digital power supply Digital Power so as to prevent noise. With this configuration, the number of power supply pins (external connection terminals BE) of the semiconductor integrated circuit device 401 can be reduced. In addition, the number of electronic components mounted on the component built-in board 61 can be reduced.

Further, an inductance component added to a feed path is minimized, which facilitates design of the low-pass filter.

The low-pass filter is formed by connecting one terminal of each of the resistor R61 and the inductance element L, which are incorporated in the component built-in board 61, to a digital power supply pattern L66 and connecting the other terminal of each of the resistor R61 and the inductance element L to an analog power supply terminal B61 through the capacitor C61.

At this time, the capacitor C61 is preferably incorporated in the upper core layer Co61 that is located near the power supply terminal B61. Further, in order to minimize the feed path, the digital power supply preferably has a configuration in which a pattern is formed on the metal wiring layer L66 that can be connected to the resistor R61 with a non-through electrode BUV61 or the like that is located near the lower core layer Co62.

As described above, the semiconductor integrated circuit device 401 according to the third embodiment preferably has a configuration in which the capacitor C61 serves as the first electronic component; the resistor R61 or the inductance element L serves as the second electronic component; one end of each of the second electronic component R61, L is connected to the digital power supply line L66, and the other end of each of the second electronic component R61, L is connected to the analog power supply terminal B61 of the third electronic component SoC through the first electronic component C61; and the component built-in board 61 constitutes a filter circuit.

Other Embodiments

The first to third embodiments illustrate the configurations of the semiconductor integrated circuit devices 101, 201, 301, and 401. In the semiconductor integrated circuit devices 101, 201, 301, and 401 according to the embodiments, a heat spreader may be provided on the electronic components mounted on the component built-in boards 21, 31, 41, and 51, to thereby suppress a stress applied to the mounted electronic components.

Figure 11:
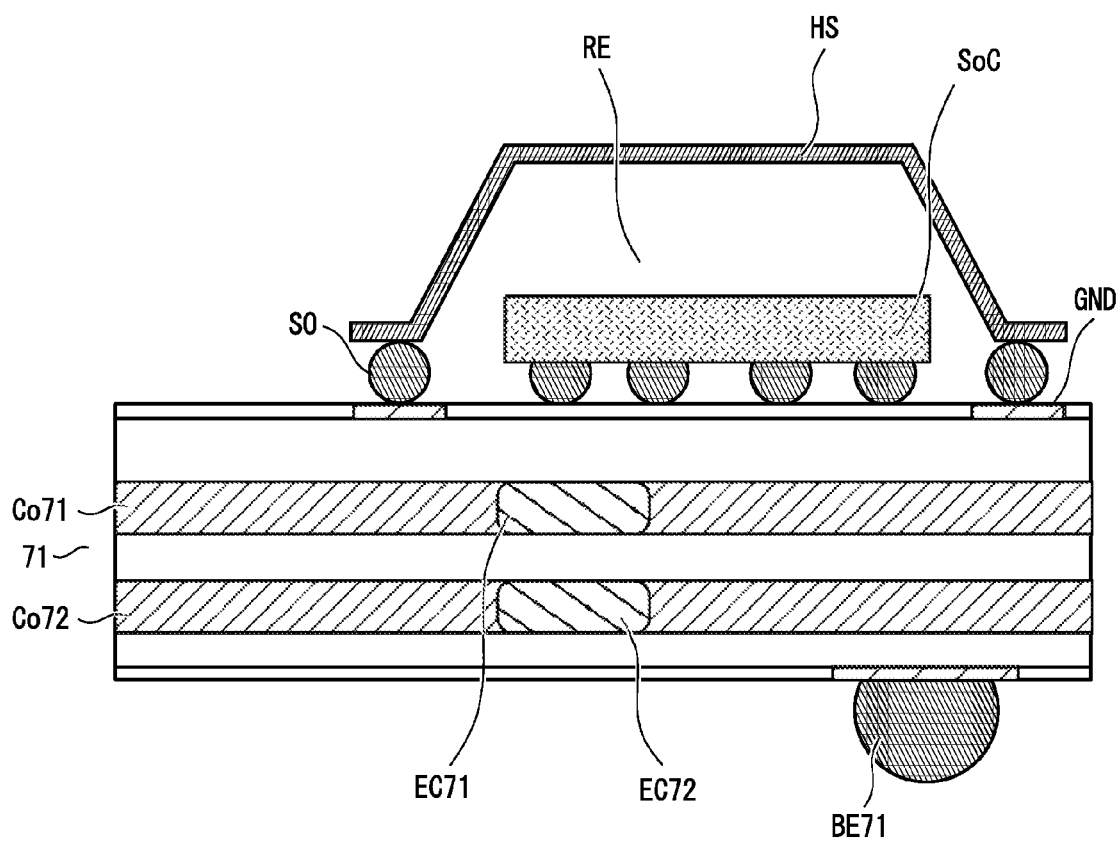
FIG. 11 is a sectional view showing a schematic configuration of a semiconductor integrated circuit device 501 according to other embodiment.

FIG. 11 is a sectional view showing a schematic configuration of a semiconductor integrated circuit device 501 according to other embodiment.

A heat spreader HS is further provided on the SoC that is flip-chip connected to a component built-in board 71. The heat spreader HS is formed of, for example, copper. The heat spreader HS is connected to a GND terminal of the component built-in board 71 through a solder SO. A conductive gel-like thermal resin, such as grease, is filled in a space between the component built-in board 71 and the SoC and the heat spreader HS.

With this configuration, a stress applied to the SoC mounted on the component built-in board 71 can be suppressed.

The invention made by the present inventor has been described above with reference to the embodiments. However, the present invention is not limited to the embodiments described above and can be modified in various ways without departing from the scope of the invention.

The first to third embodiments and other embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit device comprising:
   a component built-in board in which at least a first core layer on which a first electronic component is mounted, a second core layer on which a second electronic component is mounted, an adhesive layer arranged between the first core layer and the second core layer, and a wiring layer are stacked;
   a third electronic component mounted in a first core layer side of the component built-in board and electrically connected to at least one of the first electronic component and the second electronic component through the wiring layer; and
   an external connection terminal formed in a second core layer side of the component built-in board and electrically connected to at least one of the first electronic component and the second electronic component through the wiring layer.

2. The semiconductor integrated circuit device according to claim 1, wherein the first electronic component and the second electronic component are arranged on substantially the same plane coordinates.

3. The semiconductor integrated circuit device according to claim 1, wherein the first electronic component and the second electronic component are arranged substantially immediately below a power supply terminal of the third electronic component.

4. The semiconductor integrated circuit device according to claim 1, wherein the second electronic component is arranged in such a manner that plane coordinates of the second electronic component partially overlap plane coordinates of a plurality of the first electronic components.

5. The semiconductor integrated circuit device according to claim 1, wherein the component built-in board includes a through electrode penetrating through at least the first core layer, the adhesive layer, and the second core layer.

6. The semiconductor integrated circuit device according to claim 5, wherein
   the first electronic component is a low-capacity capacitor,
   the second electronic component is a high-capacity capacitor, and
   the third electronic component is electrically connected to the first electronic component without involving the through electrode, and is electrically connected to the second electronic component via the through electrode.

7. The semiconductor integrated circuit device according to claim 1, wherein
   a potential is supplied to a plurality of the third electronic components from the same external connection terminal through one of the first electronic component and the second electronic component different from said at least one thereof.

8. The semiconductor integrated circuit device according to claim 1, wherein
   the first electronic component is a capacitor,
   the second electronic component is one of a resistor and an inductance element,
   one end of the second electronic component is connected to a digital power supply line, and another end of the second electronic component is connected to an analog power supply line of the third electronic component through the first electronic component, and
   the component built-in board constitutes a filter circuit.

9. A printed board comprising:
   a component built-in board in which at least a first core layer on which a first electronic component is mounted, a second core layer on which a second electronic component is mounted, an adhesive layer arranged between the first core layer and the second core layer, and a wiring layer are stacked,
   wherein the wiring layer includes:
     a front-surface-side wiring layer for electrically connecting a third electronic component mounted in a first core layer side of the component built-in board to at least one of the first electronic component and the second electronic component; and
     a back-surface-side wiring layer for electrically connecting an external connection terminal formed in a second core layer side of the component built-in board to at least one of the first electronic component and the second electronic component.

10. A manufacturing method of a semiconductor integrated circuit device, comprising:

forming cavities in a first core layer and a second core layer, respectively, the first core layer and the second core layer each having a wiring layer formed thereon;

mounting a first electronic component in the cavity of the first core layer and mounting a second electronic component in the cavity of the second core layer;

forming a component built-in board by stacking the first core layer on which the first electronic component is mounted and the second core layer on which the second electronic component is mounted; and mounting a third electronic component in a first core layer side of the component built-in board to be electrically connected to at least one of the first electronic component and the second electronic component through the wiring layer, and forming an external connection terminal in a second core layer side of the component built-in board to be electrically connected to at least one of the first electronic component and the second electronic component through the wiring layer.

* * * * *